United States Patent [19]

Spencer et al.

[11] Patent Number: 5,002,926

[45] Date of Patent: Mar. 26, 1991

[54] CERAMIC COMPOSITION

[75] Inventors: Nicholas D. Spencer, Washington, D.C.; Leonard E. Dolhert, Clarksville, Md.

[73] Assignee: W. R. Grace & Co.- Conn., New York, N.Y.

[21] Appl. No.: 201,988

[22] Filed: Jun. 3, 1988

Related U.S. Application Data

[63] Continuation-in-part of Ser. No. 155,340, Feb. 12, 1988, which is a continuation-in-part of Ser. No. 95,083, Sep. 11, 1987.

[51] Int. Cl.⁵ .................................................. H01L 39/12
[52] U.S. Cl. ...................................... 505/1; 505/738; 505/783
[58] Field of Search ............................. 505/1, 734–741, 505/776–785; 427/192, 215

[56] References Cited

U.S. PATENT DOCUMENTS

| | | | |
|---|---|---|---|
| 4,804,649 | 7/1989 | Sherif | 505/1 |
| 4,839,339 | 6/1989 | Bunker et al. | 505/1 |
| 4,870,052 | 9/1989 | Engler et al. | 505/1 |
| 4,880,771 | 11/1989 | Cava et al. | 505/1 |
| 4,894,361 | 1/1989 | Subramanian | 505/1 |

OTHER PUBLICATIONS

Hazen et al., "100K Superconducting Phases in the Tl-Ca-Ba-CuO-System", Physical Review Letters, vol. 60, No. 16, Apr. 1988, pp. 1657-1660.
Shenh et al., "Bulk Superconductivity at 120K in the Tl-Ca/Ba-Cu-O System", Letters to Nature, Vol. 332, 10 Mar. 1988, pp. 138-139.
Kaneko et al., "On the Precipitation Method for the Preparation of High Tc M-X-Cu-O (M=Ba, Sr, X=La, Y) System," Japanese Journal of Applied Physics, vol. 26, No. 5, May, 1987, pp. L734-L735.
Fujiki et al., "Preparation of High Tc-Y-Ba-Cu-O Superconductor Using Colloidal Methods," Jul., 1987, Japanese Journal of Applied Physics, pp. L 1159-1160.
Wu et al., Superconductivity at 93K in a New Mixed Phase Y-Ba-Cu-O Compound System at Ambient Pressure, Phys. Rev. Lett., 58, 908-910 (2 Mar. 1987).
Engler et al., Superconductivity Above Liquid Nitrogen Temperature: Preparation and Properties of a Family of Perovskite-Based Superconductors, J. Am. Chem. Soc., 109, 2848-2849 (1987).
Wang et al., Comparison of Carbonate, Citrate, and Oxalate Chemical Routes to the High-Tc Metal Oxide Superconductors $La_{2-x}Sr_xCuO_4$, Inorg. Chem., 26, 1474–1476 (1987).
Bednorz, J. G. et al., Possible High Tc Superconductivity in the Ba-La-Cu-O System, Zeit. Phys. B., 64, 189-193 (1986), (English translation.).
Sheng, Z. Z. et al., Superconductivity in the Rare Earth-Free Tl-Ba-Cu-O System above Liquid Nitrogen Temp, Nature, 332, 55-58 (1988).
"Nota Bene" in High Tc Update, vol. 2, No. 6, p. 1 Mar. 15, 1988.
Subramanian, M. A. et al., Science, 239, p. 1015, Feb. 20, 1988.
Gao, L. et al., Nature, 332, 623-624 (1988).
Michel, C. et al., Oxygen Intercalation in Mixed Valence Copper Oxides Relates to the Perovskites, Rev. de Chim. Minerale, t. 21, 407-425 (1984).
Dagani, R., New Class of Superconductors Pushing Temperatures Higher, C & EN, May 16, 1988, pp. 24-29.
Hazen, R. M., Perovskites, Sci. Amer., pp. 74-81, Jun. 1988.
Voigt, J. A. et al., A Hydroxycarbonate Route to Superconductor Precursor Powders, paper available at Fall meeting of Materials Research Society, Boston, late Nov. 1987.
Sheng, Z. Z., et al., Superconductivity Above 90K in the Tl-Ba-Cu-O System, Phys. Rev. Lett. (available as copy of typescript).
Hermann, A. M. et al., Melt-Processible Rare Earth-Ba-Cu-O Superconductors Based on Molten Ba-Cu Oxides, Appl. Phys. Lett., 51, 1854-1856 (Nov. 30, 1987).
Cava, R. J. eta l., Bulk Superconductivity at 91K in Single-Phase Oxygen-Deficient Peroskite $Ba_2YCu_3O_{9-\delta}$, Phys. Rev. Lett., 58, 1676-1679 (20 Apr. 1987).
Nguyen, Ninh et al., Oxygen Defect K2NiF4-Type Oxides: The Compounds $La_{2-x}Sr_xCuO_{x-x/2+\delta}$, Jour. Solid State Chem., 39, 120-127 (1981).
Nguyen, N. et al., Oxydes Ternaires de Cuivre a Valence Mixte de Type K2NiF4 Deficitaires en Oxygene: Evolution Progressive d'un Etat Semi-conducteur vers un Etat Semi-metallique Des Oxydes $La_{2-x}Sr_x$-$CuO_{4-x/2+\delta}$, J. Phys. Chem. Solids, 44, 389-400 (1983).
Shaplygin, I. S. et al., Preparation and Properties of the Compounds $Ln_2CuO_4$ (Ln=La, Pr, Nd, Sm, Eu, Gd) and Some of Their Solid Solutions, Russ. J. Inorg. Chem., 24, 1478-1485 (1979).

Primary Examiner—William R. Dixon, Jr.
Assistant Examiner—Chris Gallo
Attorney, Agent, or Firm—William W. McDowell, Jr; Edward J. Cabic

[57] ABSTRACT

Improved process for making Tl-Ca-Ba-Cu oxide superconductors. A solution of the nitrated of Ca, Ba, and Cu is reacted with a quaternary ammonium carbonate in a slurry (heel) of $Tl_2O_3$. Carbonates of Ca, Ba, and Cu precipitate homogeneously on the $Tl_2O_3$ particles. Solids are recovered, dried, and heated to make a superconductor. The method minimizes introdution of contaminants. Novel compositions result.

23 Claims, No Drawings

CERAMIC COMPOSITION

This is a continuation-in-part of co-pending application S.N. 155,340 filed Feb. 12, 1988, which is a continuation-in-part of application S.N. 095,083 filed Sept. 11, 1987. Both applications are herein incorporated by reference in their entireties.

FIELD OF THE INVENTION

This invention relates to the preparation of ceramics and more particularly to an improvement in preparing the metal oxide system known as Tl-Ca-Ba-Cu-O.

SUMMARY OF THE INVENTION

In its broadest sense the invention involves co-precipitating carbonates of copper and at least one, preferably at least two, alkaline earth metals (Be, Mg, Ca, Sr, Ba) onto finely divided water-insoluble nuclei (alumina, $Tl_2O_3$, Tl metal, or the like) in aqueous media, followed by recovering and drying the solids, then heating the dried solids to form the final ceramic product. Under preferred conditions the final product is superconducting.

More specifically, an aqueous solution of compounds of certain metals (e.g., nitrates of Ca, Ba, and Cu) is added slowly and simultaneously with an aqueous solution containing carbonate ions, to an aqueous suspension of $Tl_2O_3$ particles (i.e., a heel), whereby carbonates of the metals are co-precipitated onto the $Tl_2O_3$ particles. The solids are recovered, dried, and calcined. In the preferred process the result is superconducting.

All of our final fired products find utility in the general field of ceramics, e.g., as insulators, glazes, circuit boards, etc. Some are superconductors; some are not. According to a table in C&EN, May 16, 1988, p. 26, superconductivity (or its lack) has been reported for $Tl_a$-$Ca_b$-$Ba_c$-$Cu_d$-$O_x$ oxides as follows:

| a | b | c | d | x | $T_c$ (°K.) |
|---|---|---|---|---|---|
| 1 | 0 | 2 | 1 | (e) | (not superconducting) |
| 1 | 1 | 2 | 2 | (e) | ca. 80, 103 |
| 1 | 2 | 2 | 3 | (e) | ca. 110 |
| 2 | 0 | 2 | 1 | 6 | ca. 80-85 (f) |
| 2 | 1 | 2 | 2 | 8 | 108 |
| 2 | 2 | 2 | 3 | 10 | 125 |

(e) Not determined.
(f) Measurement in dispute; may not be superconducting.

The class of compounds made in our invention includes (among others) all the above.

BACKGROUND OF THE INVENTION

It has long been known that the effective resistivity of certain metals was sometimes substantially eliminated when the metal was exposed to low temperature conditions. Of particular interest were the metals and metal oxides which can conduct electricity under certain low temperature conditions with virtually no resistance. These have become known as superconductors. Certain metals, for example, are known to be superconductive when cooled to about 4° on the Kelvin scale (°K.), and certain niobium alloys are known to be superconductive at about 15° K., some as high as about 23° K.

Discovery of superconductivity in the system La-Ba-Cu-O (J. G. Bednorz and K. A. Muller, Zeit. Phys. B 64, 189–193 [1986]) has stimulated the search for other systems, particularly with a view to substituting other elements for the rare earths (RE) used in the earlier materials. For example, replacement of RE by Bi and Tl has been reported. (See M. A. Subramanian et al., Science, 239, p. 1015 (1988); L. Gao et al., Nature, 332, pp. 623–624 (1988). In preparing the system Tl-Ba-Cu-O, Z. Z. Sheng and A. M. Hermann "Superconductivity in the Rare Earth-Free Tl-Ba-Cu-O System above Liquid Nitrogen Temperature," Nature, 332, pp. 55–58 (1988), first mixed and ground $BaCO_3$ and CuO to obtain a product which they heated, then intermittently reground to obtain a uniform black Ba-Cu-Oxide powder, which was then mixed with $Tl_2O_3$, ground, and heated, with formation of a superconducting material. It was noted that the Tl oxide partially melted and partially vaporized.

The superconductor system Tl-Ca-Ba-Cu-O was also reported in a paper by Sheng and Hermann, "Bulk Superconductivity at 120 K in the Tl-Ca-Ba-Cu-O System," Nature, 332, pp. 138–139 (1988). The authors reported "stable and reproducible bulk superconductivity above 120 K with zero resistance above 100 K". According to the paper the composition was prepared by mixing and grinding together $Tl_2O_3$, CaO and $BaCu_3O_4$. The ground mixture was pressed into a pellet and heated in flowing oxygen. The result was cooled and found to be superconducting.

Our invention is an improvement in the latter Sheng-Hermann process of making Tl-Ca-Ba-Cu-O superconductors.

See also the paper by Hazen et al, "100 K Superconducting Phases in the Tl-Ca-Ba-Cu-O System," Phys. Rev. Let., 60, pp. 1657–1660 (1988), which refers to two superconducting phases, $Tl_2Ca_2Ba_2Cu_3O_{10+}$ and $Tl_2Ca_1Ba_2Cu_2O_{8+}$, both with onset $T_c$ near 120 K and zero resistivity at 100 K. Preparation included grinding together $Tl_2O_3$, CaO, and $BaCu_3O_4$ (or $Ba_2Cu_3O_5$), followed by heating.

And see "Nota Bene" in High $T_c$ Update, vol. 2, No. 6, p. 1, Mar. 15, 1988, further re properties of the Tl-Ca-Ba-Cu-O system.

Wang et al., Comparison of Carbonate, Citrate, and Oxalate Chemical Routes to the High-$T_c$ Metal Oxide Superconductors $La_{2-x}Sr_xCuO_4$, Inorg. Chem. 26, 1474–1476 (1987) discloses a carbonate precipitation technique. The precipitant was $K_2CO_3$. According to the paper, it was necessary to wash the precipitate repeatedly, an obvious disadvantage in production work. Washing was necessary because potassium adversely affects superconductivity properties of the finished materials. If we wash repeatedly, we remove barium, a highly detrimental loss in our process.

From the technical viewpoint it may seen obvious that co-precipitated carbonates would provide enhanced homogeneity. However, the technical solution to the problem encounters serious difficulties. Thus the Wang et al process, using potassium carbonate (or sodium carbonate) nécessitated numerous washings and apparently left detectable amounts of alkali in the ceramic base even so. As noted serial washings remove Ba, and would be unworkable in our process. Nor is it merely sufficient that the carbonate be derived from a cation that would burn off completely. For example, ammonium carbonate does not work, because a pH below 7 is required to prevent formation of copper tetraammine, but under these conditions bicarbonate ion is formed, with consequent formation of barium bicarbonate, which, being slightly soluble, disrupts the desired stoichiometry. Quaternary ammonium carbonates, on the other hand, form the desired metal carbonates simply and cleanly as a coating on $Tl_2O_3$ particles without troublesome side-formation of complexes or coordination compounds, with firm and precise retention of the intended stoichiometry. The coated particles are readily recovered for further processing.

DETAILED DESCRIPTION OF THE INVENTION

We start with three base liquids (all preferably made up with deionized water):

(1) Premix, an aqueous solution of soluble salts (e.g., nitrates, acetates, etc.) of Cu and at least one alkaline earth metal, the salts being present in amounts to provide an atomic ratio of $X_b$-$Z_c$-$Cu_d$ where X and Z are different alkaline earth metals, and b, c, and d independently have a value within the range 0.1–10; provided that, under certain conditions hereinafter explained, when X is Ca and Z is Ba, b may be zero.

(2) Solution of quaternary ammonium carbonate (described below);

(3) Aqueous dispersion of finely divided waterinsoluble nuclei ("heel"). Suitably the powder is fine enough so that at least about 90% passes through a 100 mesh U.S. screen. Further description and use of this dispersion will use $Tl_2O_3$ as exemplar, suitably finely divided $Tl_2O_3$ powder slurried as a 1–5 weight % dispersion in water.

Additionally, an aqueous solution of a quaternary ammonium hydroxide is used. This is added drip-wise to the heel during the course of the reaction to maintain the pH of the reaction mixture in the range of about 7–11. Below this pH some of carbonates (e.g., Ba) tend to redissolve as the bicarbonate.

The reaction is suitably carried out at room temperature. To start, the heel of the thallium oxide dispersion is stirred, and addition of the solution of the combined nitrates into the heel is begun. The addition is slow and is metered to match the addition of the quaternary ammonium carbonate, which is similarly metered. The reaction time will depend on the amount of materials being reacted. In Example 1, we added 600 ml of nitrates and 600 ml of quaternary ammonium carbonate over a period of about half an hour, or about 20 ml of each solution per minute. The rate may go up with larger volumes of materials. However, under conditions of simultaneous addition, there will be little or no stoichiometric excess of either the nitrate solution or the carbonate solution in the heel at any time. Further, reaction of the reagents is almost instantaneous as added, and as a result, very little free metal ions or carbonate ions exist at any given moment.

The major component of the final reaction slurry is considered to be $Tl_2O_3$ particles coated with co-precipitated carbonates of Ca, Ba, and Cu. However, some brown color in the solids is evident, indicating that some of the thallium oxide was thinly coated. ($Tl_2O_3$ is dark brown.) Some carbonates may have coprecipitated separately, i.e., not onto the particles of thallium oxide. When the reaction product is filtered and dried, it is blue throughout, suggesting that the brown $Tl_2O_3$ is substantially covered.

We may note that thallium carbonate, $Tl_2O_3$ is fairly water soluble and hence cannot be effectively precipitated from its nitrate solution as the carbonate, alone or with other carbonates. That particular route to homogeneity is therefore unavailable.

Our invention is particularly applicable to the system $Tl_a$-$Ca_b$-$Ba_c$-$Cu_d$-$O_x$, where a, b, and c are independently about 0.5–3, preferably 1 or 2; d is about 1–4, preferably 2 or 3; and x is indeterminate, depending on the compound. These ratios carry through from the co-precipitated carbonate stage to the final oxide product. In particular our invention contemplates preparation of atomic ratios of $Tl_a$-$Cu_b$-$Ba_c$-$Cu_d$ in the co-precipitated carbonate stage (solids in slurry) through, inter alia, the final fired oxide compound, said ratios to include the following six compounds:

| Compound | a | b | c | d |
|----------|---|---|---|---|
| 1 | 1 | 0 | 2 | 1 |
| 2 | 1 | 1 | 2 | 2 |
| 3 | 1 | 2 | 2 | 3 |
| 4 | 2 | 0 | 2 | 1 |
| 5 | 2 | 1 | 2 | 2 |
| 6 | 2 | 2 | 2 | 3 |

In the above, Compound No. 6 is made in Example 1.

Indeterminancy of oxygen content is universally accepted in this particular ceramic art. The reason is not technical indifference, but is based largely on the difficulty of analysis. Some of the problems in establishing oxygen content are described in an article by Robert M. Hazen, "Perovskites," *Sci. Ame.* 258, No. 6, pp. 74–81 (1988). Accordingly, oxygen is typically reported as not determined, it being assumed that the atomic ratios of metal compounds sufficiently establish identity.

In our compounds, x may be in the range of 0.5–50.

The invention provides several novel compositions and processes:

Compositions (1) Premix Solution. This is an aqueous solution of the soluble salts of Cu and of at least one alkaline earth metal, the salts being present to provide an atomic ratio of $X_b$-$Z_c$-$Cu_d$ where X and Z are different alkaline earth metals, b is 0–10, and c and d are independently 0.1–10. Preferably this composition is a solution of nitrates of Ca, Ba, and Cu, and Ca, Ba, and Cu are present in an atomic ratio of $Ca_b$-$Ba_c$-$Cu_d$, where b is about 0.5–3, c is about 0.5–3, and d is about 1–4.

(2) Aqueous slurry, the solids of which comprise particles of water-insoluble nuclei coated with co-precipitated carbonates of $X_b$-$Z_c$-$Cu_d$ as defined in (1). Preferably the nuclei are $Tl_2O_3$, and $X_b$-$Z_c$-$Cu_d$ is $Ca_b$-$Ba_c$-$Cu_d$ as defined in (1).

(3) Finely-divided water-insoluble nuclei coated with co-precipitated carbonates of $X_b$-$Z_c$-$Cu_d$ as defined in (1) above, particularly, particles of $Tl_2O_3$ coated with co-precipitated carbonates of Ca, Ba, and Cu, providing $Tl_a$-$Ca_b$-$Ba_c$-$Cu_d$-O where a is about 0.5–3 and b, c, and d are as defined in (1) above.

(4) The fired mixture of (3) above, preferably under process conditions that provide a superconductor.

Comment

The point of novelty of the preferred form of Composition (4) vis-a-vis the prior art is that the Tl, Ca, Ba, and Cu oxides are present in totally homogenized form in Composition (4).

Processes (5) Forming Composition (1) above, preferably by forming a solution of nitrates of Ca, Ba, and Cu, suitably to provide an atomic ratio of $Ca_b$-$Ba_c$-$Cu_d$ as above defined.

(6) Reacting the solution of (5) with a solution of quaternary ammonium carbonate in a heel of an aqueous dispersion of particles of water-insoluble nuclei, suitably $Tl_2O_3$, at a pH of about 7–11, so as to form a co-precipitate of carbonates of Cu and at least one alkaline earth metal, e.g., Ba, suitably with Ca, on the nuclei (e.g., $Tl_2O_3$); and recovering the resulting solids.

(7) Drying the solids of (6). Drying can be done in an oven (cf. our Example 1), or (preferably) by spray drying, or by spraying the slurry onto a heated drum, or by substantially any conventional means.

(8) Calcining the dried mixture of (7). Preferably, prior process conditions are selected so that the product of calcining is a superconductor.

Our invention offers several closely related contributions to the art: (1) total homogeneity of X-Z-Cu (as above defined), e.g., Ca-Ba-Cu; (2) minimal handling and evaporation of toxic Tl; (3) zero to minimal Tl loss during heating and therefore better control of stoichiometry; and (4) minimal introduction of impurities.

We use the term "homogeneous" to mean dispersion so fine that it is practically at the atomic level. This is the type of homogeneity that results when our final reaction slurry is dried and the dried product is calcined. For example, our final Tl-Ca-Ba-Cu-O product is characterized by substantially total homogeneity.

The Carbonate Reagent

A solution of quaternary ammonium carbonate is conveniently prepared by bubbling $CO_2$ through an aqueous solution of a quaternary ammonium hydroxide until the quaternary carbonate is stoichiometrically formed and $CO_2$ is dissolved in excess. The preferred quaternary ammonium hydroxides have the formula:

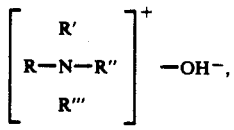

same or different members of the group
(i) alkyl, e.g., tetramethylammonium hydroxide, tetraethylammonium hydroxide, tetrapropylammonium hydroxide, dimethyldiethylammonium hydroxide, cyclopropyltrimethylammonium hydroxide and the like;
(ii) aromatic, e.g., phenyltrimethylammonium hydroxide, phenylethyldimethylammonium hydroxide, benzyltrimethylammonium hydroxide, and the like;
(iii) heterocyclic;
(iv) and any two group members may be joined in a ring whereby N becomes a ring member, e.g., dimethyl pyrrolidnium hydroxide, dimethylpyridinium hydroxide, and the like.

The quaternary carbonate corresponding to the above quaternary hydroxide is of course

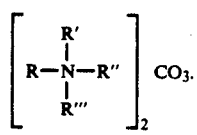

Use of the quaternaries permits: (i) facile pH control (essential for co-precipitation of the carbonates); (ii) exclusion of additional metals, such as in potassium carbonate as used in prior carbonate processes; (iii) ready burn-off of the carbonate source in the furnace; and (iv) stoichiometric co-precipitation, without formation of interfering complexes or coordination compounds.

Composition 1 — The Premix Solution

This solution is made up by dissolving the required X-Z-Cu nitrates, acetates, or other soluble salts in water, so as to provide the predetermined atomic ratio for the metals in the finished superconductor, as stated.

The Heel

The heel is prepared simply by dispersing insoluble finely divided nuclei, e.g., $Tl_2O_3$ into water, in a vessel equipped with stirrer and large enough to accommodate the anticipated addition of soluble salt (e.g., nitrate) and quaternary ammonium carbonate solutions. We prefer that the slurry heel at start comprise about 1–5 weight % $Tl_2O_3$ or other nuclei.

A small amuont (e.g., about 0.1 weight %) of an organic surfactant may be added to aid dispersion.

The Co-carbonate Slurry

The premix solution and the quaternary ammonium carbonate are added slowly, simultaneously, at constant rates, with stirring, to the heel of slurry. The two reactant solutions and the heel are suitably each about the same starting volume. The pH should be maintained at about 7–11, suitably at about 9–10, during carbonate co-precipitation. Suitably this is done by drip-wise addition of a quaternary ammonium hydroxide. Such quaternary may have the structure of quaternary ammonium hydroxide as above defined.

The solids can be recovered from the slurry using various techniques. On a laboratory scale simple filtration followed by air drying or oven drying is adequate for good homogeneity.

In the preferred embodiment, at all times during the reaction the resulting slurry will be found to contain $Tl_2O_3$ particles coated with carbonates of calcium, barium, and copper; quaternary ammonium cations; nitrate ions residual from the starting nitrate salts, stoichiometrically equivalent to the co-preciptated carbonates; and water (balance). This slurry is believed novel. It is per se an essential part of our invention. At the conclusion of the carbonate precipitation, the solids will consist of carbonates of Ca, Ba, and Cu on $Tl_2O_3$ in a predetermined atomic ratio, i.e., in the range $Tl_1$-$Ca_b$-$Ba_c$-$Cu_d$, where a, b, c, and d are as above defined. The dried solids recovered from this slurry are ready to calcine to make a superconductor characterized by substantial homogeneity. Calcination converts the carbonates to oxides and removes any residual nitrates, moisture, or organic material.

The following Example illustrates without limiting the invention.

EXAMPLE 1

Preparation of $Tl_2Ca_2Ba_2Cu_3O_{10}$

Precipitation:

$Ba(NO_3)_2 \cdot 4 H_2O$, 15.8 g; $Cu(NO_3)_2 \cdot 2-1/2H_2O$, 20.93 g; and $Ca(N_3)_2 \cdot 4 H_2O$, 14.17 g were placed in a 1000-ml beaker and 500 ml deionized water at room temperature was added with stirring, to bring the nitrates into solution. The solution was diluted to the 600 ml mark with stirring to achieve complete solution.

200 ml tetramethylammonium carbonate (from 25 weight % solution of tetramethylammonium hydroxide in water), pH 10.00, was placed in a second 1-L beaker and diluted up to the 600-ml mark with deionized water.

$Tl_2O_3$ as a finely divided powder, 13.7 g, was placed in a 4-L beaker and 500 ml deionized water was added with stirring. The dispersion was diluted with deionized water to the 600-ml mark, to provide a thallium oxide heel.

The solutions of nitrates and tetramethylammonium carbonate were then slowly pumped simultaneously into the thallium oxide heel, with stirring. The heel pH was maintained at about 9 by dripping neat tetramethylammonium hydroxide into the heel from a 500-ml burette, thereby permitting measurement of the amount used (a total of 80 ml).

Total time for transfer of nitrate and tetramethylammonium carbonate solutions to the thallium oxide heel was 31 minutes, 20 seconds.

The resulting reaction slurry was stirred for an additional 20 minutes (approximate), then filtered on double filter paper on a Buechner funnel. The filter cake was placed in a heat-resistant glass tray and dried overnight in a convection oven at 100° C. The blue cake weighed 43.70 g. It was gently broken up, and 10.86 g set aside for calcination.

Heating

The above 10.86 g, a blue powder, was placed in an alumina boat and heated in air for 8 hours at 530° C., then heated in air for 2 hours at 750° C., following which it was heated in oxygen for 2 hours at 850° C. It was then allowed to cool to room temperature. The powder was pressed into a disk and tested for superconductivity by magnetic susceptibility. The test showed superconductivity.

From the foregoing description it will be evident that our process introduces no extraneous substances into the system; viz., no cations other than Tl, Ca, Ba, and Cu enter the system. The process thus results in an oxide mix of extraordinary purity at all stages.

Extraneous Materials

Prior art processes conveniently enhance homogeneity by grinding the calcined intended superconductor, followed by recalcining. In some instances this sequence may be repeated several times. It is known that improved homogeneity in the general case enhances superconductivity. The problem here is that effective grinding inevitably and inherently introduces impurities into the ceramic, simply by impacting the ceramic between the balls and walls (or other grinding surfaces) of the grinding mill. It is known, for example, that silica or stainless steel balls in a ball mill lose significant mass over a period of use. This mass of course disappears into whatever was being milled. Mills that comminute by particle self-impact lose metal by wall-scouring, particularly in the area of stream entry. If the product is ground in a ball mill using quartz or silica balls, some of the impurity is silica.

Thus, the firing-grinding-refiring technique rapidly achieves a balance: Improvement in homogeneity tends to be matched by contamination build-up that cancels part or all of the improvement.

As above described, our process minimizes the grinding problem in the general case. Our product can of course be subjected to the conventional grinding-shaping-refiring cycle, but this is superfluous.

We claim:

1. Aqueous slurry, the solids of which comprise particles of water-insoluble nuclei of alumina, $Tl_2O_3$, or Tl metal coated with co-precipitated carbonates of $X_b$-$Z_c$-$Cu_d$ where X and Z are different alkaline earth metals, b is 0–10 and c and d independently have a value within the range of 0.1–10.

2. Aqueous slurry according to claim 1 the solids of which comprise particles of $Tl_2O_3$ coated with co-precipitated carbonates of Ca, Ba, and Cu.

3. The dried solids of claim 1.

4. The dried solids of claim 2, providing a ratio of $Tl_a$-$Ca_b$-$Ba_c$-$Cu_d$ where a, b and c are about 0.5–3; and d is about 1–4.

5. Composition consisting essentially of carbonates of Ca, Ba, and Cu co-precipitated on particles of alumina, $Tl_2O_3$ or Tl metal.

6. Composition according to claim 5 consisting essentially of carbonates of Ca, Ba, and Cu co-precipitated on particles of $Tl_2O_3$.

7. Composition according to claim 6 wherein the atomic ratio of the components is $Tl_a Ca_b$-$Ba_c$ -$Cu_d$ where a, c, and d are independently in the range of about 0.1–10, and b is in the range of about 0–10.

8. Composition according to claim 7 wherein the atomic ratio of Tl, Ca, Ba, and Cu is represented by $Tl_a$-$Ca_b$-$Ba_c$-$Cu_d$ where a and c are independently about 0.5–3, b is about 0–3, and d is about 1–4.

9. Composition according to claim 8 where
a=1
b=0
c=2
d=1.

10. Composition according to claim 8 where
a=1
b=1
c=2
d=2.

11. Composition according to claim 8 where
a=1
b=2
c=2
d=3.

12. Composition according to claim 8 where
a=2
b=0
c=2
d=1.

13. Composition according to claim 8 where
a=2
b=1
c=2
d=2.

14. Composition according to claim 8 where
a=2
b=2
c=2
d=3.

15. Process comprising reacting an aqueous solution of the soluble salts of Cu and of at least one alkaline earth metal, the salts being present to provide an atomic ratio of $X_b$-$Z_c$-$Cu_d$ where X and Z are different alkaline earth metals, b is 0–10 and c and d independently have a value within the range 0.1–10 with a solution of quaternary ammonium carbonate in a heel of an aqueous dispersion of particles of water-insoluble nuclei of alumina, $Tl_2O_3$, or $Tl$ metal so as to form a co-precipitate of carbonate on the nuclei, and recovering and drying the resulting solids.

16. Process according to claim 15 comprising reacting an aqueous solution of the nitrates of Ca, Ba, and Cu; the nitrates being present to provide an atomic ratio of $Ca_b\text{-}Ba_c\text{-}Cu_d$, where b is about 0.5–3, c is about 0.5–3, and d is about 1–4; with a solution of quaternary ammonium carbonate in a heel of an aqueous dispersion of particles of $Tl_2O_3$ at a pH of about 7–11 so as to form a co-precipitate of carbonates of Ca, Ba, and Cu on the $Tl_2O_3$; and recovering and drying the resulting solids.

17. Process according to claim 16 where the co-precipitated carbonate on $Tl_2O_3$ provide an atomic ratio of $Tl_a\text{-}Ca_b\text{-}Ba_c\text{-}Cu_d$ where a, c, and d are about 1–3 and b is about 0–3.

18. Dried solids prepared by the process of claim 16.

19. Process according to claim 17 comprising heating the recovered dried solids to form a superconductor, provided that when $b=0$, a and $c=2$ and $d=1$.

20. Process comprising;
(A) preparing a pre-mix comprising dissolving nitrates of Ca, Ba, and Cu in water in amounts to provide atomic ratios of $Ca_b\text{-}Ba_c\text{-}Cu_d$, where b and c are about 0.5–3, and d is about 1–4
(B) preparing a heel comprising particles of $Tl_2O_3$ dispersed in water, about 1–5 weight % $Tl_2O_3$;
(C) adding an aqueous solution of quaternary ammonium carbonate to (B) and simultaneously adding (A) to (B), both at controlled addition rate so as to co-precipitate the carbonates of Ca, Ba, and Cu onto the $Tl_2O_3$ particles without introducing any substantial stoichiometric excess of (A) or quaternary ammonium carbonate; into (B); while maintaining a pH of about 9–10 in the reaction solution;
(D) recovering and drying the resulting solids; and
(E) calcining the solids of (D) to form a superconductor.

21. Process according to claim 20 wherein the superconductor in (E) has the atomic ratio $Tl_a Ca_b\text{-}Ba_c\text{-}Cu_d$ where a, c, and d are 1–3 and b is 0–3, provided that when $b=0$, a and $c=2$ and $d=1$.

22. Process according to claim 20 wherein in (E) the dried solids are heated in air for 8 hours at 530° C., then heated in air for 2 hours at 750° C., the cooled then heated in oxygen for 2 hours at 850° C., then cooled, thereby becoming superconducting.

23. Process according to claim 20 wherein the quaternary ammonium carbonate is tetramethylammonium carbonate.

* * * * *